United States Patent
Vande Voorde et al.

(10) Patent No.: US 7,038,242 B2
(45) Date of Patent: May 2, 2006

(54) AMORPHOUS SEMICONDUCTOR OPEN BASE PHOTOTRANSISTOR ARRAY

(75) Inventors: Paul J. Vande Voorde, San Mateo, CA (US); Frederick A. Perner, Palo Alto, CA (US); Dietrich W. Vook, Menlo Park, CA (US); Min Cao, Mountain View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 189 days.

(21) Appl. No.: 09/795,608

(22) Filed: Feb. 28, 2001

(65) Prior Publication Data

US 2002/0117682 A1 Aug. 29, 2002

(51) Int. Cl.
*H01L 27/15* (2006.01)
*H01L 31/12* (2006.01)
*H01L 33/00* (2006.01)

(52) U.S. Cl. .......................... 257/79; 257/88
(58) Field of Classification Search .......... 257/13, 257/21, 53, 79, 80, 149, 355, 356, 357, 358, 257/103, 88, 462
See application file for complete search history.

(56) References Cited

U.S. PATENT DOCUMENTS

| | | | | |
|---|---|---|---|---|
| 4,341,954 A | * | 7/1982 | Mizushima et al. | 250/211 |
| 4,907,054 A | | 3/1990 | Berger et al. | |
| 4,996,573 A | | 2/1991 | Hack et al. | 357/23.7 |
| 5,101,253 A | | 3/1992 | Mizutani et al. | 357/30 |
| 5,243,216 A | * | 9/1993 | Noguchi et al. | 257/462 |
| 5,268,309 A | | 12/1993 | Mizutani et al. | 437/3 |
| 5,311,047 A | * | 5/1994 | Chang | 257/198 |
| 5,321,294 A | * | 6/1994 | Chino et al. | 257/85 |
| 5,453,860 A | * | 9/1995 | Akiyama et al. | 359/72 |
| 5,734,191 A | * | 3/1998 | Chi et al. | 257/462 |
| 5,763,909 A | | 6/1998 | Mead et al. | 257/291 |
| 5,818,088 A | * | 10/1998 | Ellis | 257/355 |
| 5,885,498 A | * | 3/1999 | Matsuo et al. | 252/583 |
| 5,998,806 A | | 12/1999 | Stiebig et al. | 257/55 |
| 6,018,187 A | | 1/2000 | Theil et al. | 257/458 |
| 6,058,223 A | * | 5/2000 | Strohbehn | 382/312 |

FOREIGN PATENT DOCUMENTS

| | | | |
|---|---|---|---|
| JP | 355140266 A | * | 11/1980 |
| WO | WO9727503 | * | 7/1997 |

OTHER PUBLICATIONS

Ben G. Streetman and Sanjay Banerjee, Solid State Electronic Devices 2000, Prentice Hall, Inc., 5$^{th}$ edition, P 386.*

Yasuo Nara & Masakiyo Matsumura Japanes Journal of Applied Physics vol. 23, No. 9 Sep. 1984 P L714–L715 "Application of Hydrogenated Amorphous–Silcon to Bi–Polar Transistors".

Yasuo Nara & Masakiyo Matsumura Physica 129 B (1985) "Hydrogenated Amorphous–Silicon Bipolar Transistors".

(Continued)

*Primary Examiner*—Hoai Pham
*Assistant Examiner*—Dana Farahani (57) ABSTRACT

An array of light-sensitive sensors utilizes bipolar phototransistors that are formed of multiple amorphous semiconductor layers, such as silicon. In the preferred embodiment, the bipolar transistors are open base devices. In this preferred embodiment, the holes that are generated by reception of incoming photons to a particular open base phototransistor provide current injection to the base region of the phototransistor. The collector region is preferably an intrinsic amorphous silicon layer. The phototransistors may be operated in either an integrating mode in which bipolar current is integrated or a static mode in which a light-responsive voltage is monitored.

11 Claims, 8 Drawing Sheets

OTHER PUBLICATIONS

Hack, Schiff, Madan, Powell & Matsuda Mat. Res. Soc. Symp. Proc. vol. 377 "Amorphous Silicon Technology–1995" Symposium held Apr. 18–21, 1995.

A. Nascetti & F. Palma Feb. 6, 1997 Solid State Electronics vol. 42 No. 3 p. 339–348 1998 "A New Analytical Model for the Amorphous Silicon Bulk Barrier Phototransistor".

C.Y. Chang B.S. Wu Y.K. Fang R.H.Lee IEDM May 1985 p 432–435. Amorphous Silicon Bipolar Transistor with High Gain (>12) and High Speed (>30u s).

C.Y. Chang B.S. Wu Y.K. Fang R.H. Lee Mat. Res. Soc. Symp. Proc. vol. 54 p. 781–785 Amorphous Silicon Ultra Thin Base Bipolar Phototransistor with High Performance Dec. 1985.

BS Wu, CY Chang, YY Fang & RH Lee IEEE Transactions on Electron Devices vol. ED. 32 No. 11 Nov. 1985 p. 2192–2196 "Amorphous Silicin Phototransistor on a Glass Substrate".

Kawase, T., et al., "All–Polymer Thin Film Transistors Fabricated by High–Resolution Ink–jet Printing," 46th Annual IEEE International Electron Devices Meeting, Dec. 11–13, 2000.

Sheraw, C.D., et al., "Fast Organic Circuits on Flexible Polymeric Substrates," IEEE 0–7803–6441–4, Apr. 2000.

* cited by examiner

FIG. 9

AMORPHOUS SEMICONDUCTOR OPEN BASE PHOTOTRANSISTOR ARRAY

TECHNICAL FIELD

The invention relates generally to imaging arrays and more particularly to enhancing the sensitivity of photosensors to incoming light.

BACKGROUND ART

A one-dimensional array or a two-dimensional array of imaging sensors may be connected to processing circuitry in order to generate image information relating to an area at which the array is directed. Each sensor generates a signal that is responsive to the light received at the sensor. The signal may represent intensities of colors of light received by the sensor.

Charged coupled devices (CCDs) are used in many imaging applications. An element of a CCD array integrates a charge that is generated by incoming light, with the charge being accumulated in a potential well along the surface of a semiconductor chip on which the CCD array is fabricated. The accumulated charges of the array are sequentially shifted to on-chip circuitry that transfers the signals to other circuitry that is not integrated onto the chip.

While a CCD operates well for its intended purposes, the "gain" that is experienced at each element (i.e., pixel) is less than one. The gain may be measured at the current level (output current/photon current) or at the electron level (output electrons/input photons). With a gain at the electron level that has a maximum of unity, the signal-to-noise ratio at the output of a particular element is limited.

U.S. Pat. No. 6,018,187 to Theil et al. describes the use of PIN diodes as an alternative to CCD technology. A pixel interconnect structure is formed on the top surface of a substrate, such as a silicon substrate. The pixel interconnect structure is a dielectric layer, such as silicon oxide or silicon nitride, having conductive vias extending from selected locations on the surface of the substrate to bottom electrodes of an array of photosensors. Preferably, the bottom electrodes are formed of amorphous silicon having an n-type dopant. A continuous intrinsic layer is formed over the bottom electrodes. A continuous layer of p-doped amorphous silicon covers the intrinsic layer, while a transparent conductor covers the p-doped layer. As a result, a PIN diode is formed for each one of the bottom electrodes. The PIN diodes are "elevated" sensors, since they are positioned above the surface of the substrate. The pixel interconnect structure allows the elevated PIN diodes to be electrically linked to processing circuitry that is fabricated at the substrate level.

An unrelated alternative to CCD technology is described in U.S. Pat. No. 5,763,909 to Mead et al. Bipolar phototransistors are fabricated by introducing dopants into a silicon substrate. Conventional dopant implantation steps are utilized. When an array of the bipolar phototransistors is formed, the bases of the phototransistors in a particular row are capacitively coupled to a common row-select line. The emitters of all the phototransistors in a particular column are connected to a common column-select line. Thus, each phototransistor can be individually selected. The array of phototransistors provides greater gain than is available using CCD technology.

An object of the invention is to provide an imaging arrangement in which individual photosensors in an array of photosensors achieve a relatively high level of gain, so that a desired signal-to-noise ratio can be obtained.

SUMMARY OF THE INVENTION

Light sensitivity for imaging applications is enhanced by utilizing bipolar phototransistors that are formed of multiple amorphous semiconductor layers. In the preferred embodiment, the bipolar phototransistors are open base devices in which holes that are generated by incoming photons provide base-hole current injection, so as to achieve bipolar gain for the photocurrent.

In the preferred structure, each phototransistor is formed of amorphous silicon emitter, base and collector layers, but other amorphous semiconductive materials (such as the semiconducting polymer of fluorenebithiophene copolymer) may be substituted. The base and emitter layers are doped to form either an NPN bipolar transistor or a PNP bipolar transistor, while the collector layer is either undoped or is very lightly doped, i.e., the collector layer is an intrinsic layer. In the NPN embodiment, the emitter layer may be a first-deposited layer of amorphous silicon with a heavy concentration of an n-type dopant. The base layer is deposited over the emitter layer as an amorphous silicon having a p-type dopant. Then, the intrinsic collector layer is formed. The collector layer may be a continuous amorphous silicon layer or may be a layer in which a dielectric separates each pixel from adjacent pixels. A thin layer of n-doped amorphous silicon is formed atop the intrinsic collector layer. Finally, a transparent top electrode is deposited. While the emitter layer may function as the bottom electrode, preferably a separate electrode layer is formed prior to depositing the layers that define the bipolar transistors. In the PNP application, the conductivity types of the base and emitter layers are reversed, as well as the conductivity type of the thin layer above the intrinsic collector layer.

Each phototransistor may be operated in an integrating mode in which the total bipolar current is integrated for periodic reading. Alternatively, each phototransistor may be operated in a static mode in which a signal is sensed by monitoring the voltage at a particular node. As previously noted, the phototransistor is an open base device. Thus, the base layer is free from external control. As light impinges upon the intrinsic collector layer, holes and electrons are generated within the layer. In the NPN embodiment, the holes that are generated by the photons are conducted to the base layer to serve as base-hole current injection. As a consequence of the open base condition of the phototransistor, bipolar gain is achieved.

The array of phototransistors is preferably formed on the same substrate as processing circuitry for sensing and/or amplifying output signals for transfer to off-substrate circuitry. An advantage of the invention is that the current gain achieved at the phototransistor level enhances the sensitivity of the arrangement. Output fluctuations as a result of changes in light intensity are more easily distinguished from "noise."

BEST MODE FOR CARRYING OUT THE INVENTION

Figure 1:
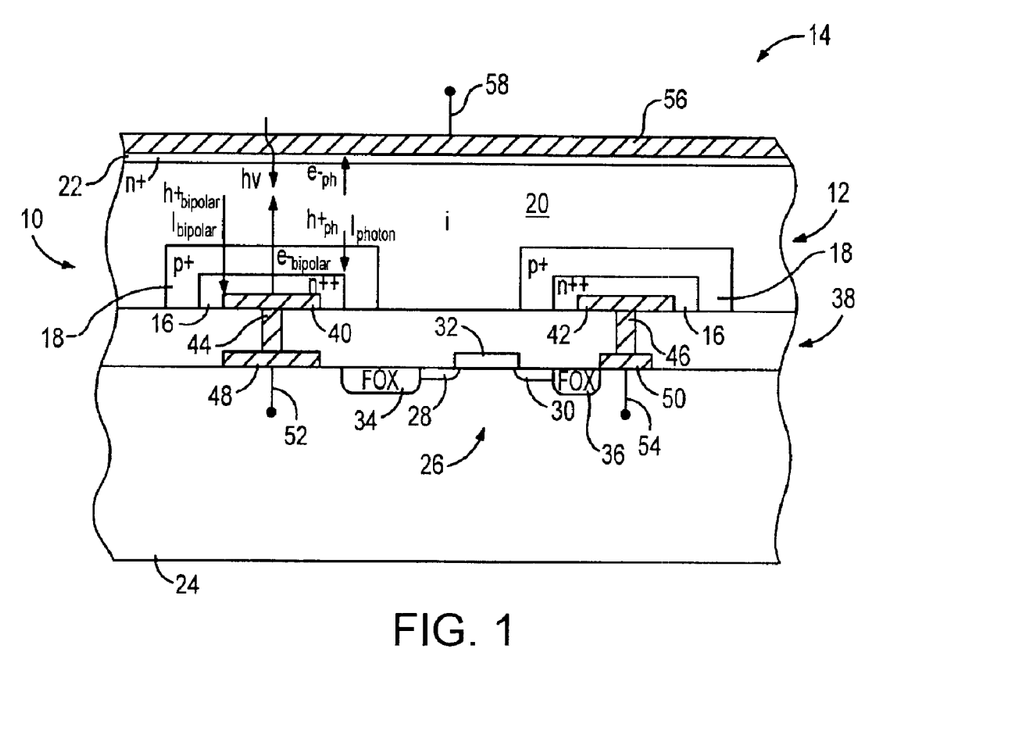
FIG. 1 is a side sectional view of two open base bipolar phototransistors in accordance with the invention.

With reference to FIG. 1, a pair of NPN phototransistors 10 and 12 of an array 14 of phototransistors is formed of a number of different amorphous semiconductor layers. The amorphous semiconductor layers will be described as being formed of amorphous silicon. However, other materials are suitable, such as the organic semiconductor fluorenebithiophene copolymer. For each of the phototransistors, an emitter 16 is an n++ layer, a base 18 is a p+ layer, and a collector 20 is an intrinsic layer. A fourth amorphous silicon layer 22 is formed atop the intrinsic collector layer. This fourth layer has an n+ conductivity type.

In the preferred embodiment, the amorphous layers that form the emitter 16, the base 18 and the collector 20 are deposited over a substrate 24, such as a silicon substrate, in which processing circuitry is formed. The processing circuitry is represented by a single transistor 26 having source/drain regions 28 and 30 and having a gate 32. As is well known in the art, the source/drain regions are formed by ion implantation, while the gate 32 is fabricated by depositing a polysilicon layer atop an oxide layer. The transistor is formed between two field oxide regions (FOX) 34 and 36.

Connectivity between the phototransistors 10 and 12 and the processing circuitry that is embedded within the substrate 24 is provided by a pixel interconnect structure 38, such as the type described above with reference to U.S. Pat. No. 6,018,187 to Theil et al. Electrodes 40 and 42 atop the pixel interconnect structure 38 are aligned with conductive vias 44 and 46 through the interconnect structure. The vias electrically connect the electrodes to conductive paths 48 and 50 on the surface of the substrate 24. As will be described more fully below, the conductive paths are connected to underlying circuitry of the substrate 24 or to external circuitry. The circuit connections are represented as nodes 52 and 54, which may be floating nodes. As one possibility, the nodes 52 and 54 may be selectively reset at a level lower than electrical "high" when the phototransistors are operated in an integrating mode for monitoring the voltage change across the two nodes 52 and 54. A top electrode layer 56 is connected to $V_{DD}$ or another high voltage constant by connection to node 58.

In the fabrication of the structure shown in FIG. 1, the process circuitry formed at the level of the substrate 24 may be provided using known techniques. The circuitry may be CMOS (Complementary Metal Oxide Silicon), BiCMOS or Bipolar. The pixel interconnect structure 38 may be a layer of silicon oxide or silicon nitride, with the vias 44 and 46 being formed of tungsten. Tungsten vias enable narrow and relatively long interconnections to be made. The tungsten vias may be formed using a chemical vapor deposition (CVD) process. However, other materials and other processes may be substituted.

Optionally, the electrodes 40 and 42 are formed of more than one layer. For example, a lower metal layer of titanium or tungsten having a thickness of approximately 500 Angstroms may be used to enhance current collection from a doped semiconductor upper layer of the electrodes. The doped semiconductor can be amorphous silicon having n-type conductivity. If a doped semiconductor material is used, the layer must have a sufficient thickness and dopant concentration to prevent the material from being fully depleted when biased during operation. However, electrodes 40 and 42 are not necessary in all applications, since the emitter 16 may be formed to contact the vias 44 and 46 or to contact the thin metal layer that is in direct contact with the vias.

The layers that form the emitter 16, base 18 and collector 20, as well as the thin layer 22, are preferably amorphous silicon. A silicon-containing gas may be used to deposit the layers using plasma enhanced chemical vapor deposition (PECVD). In addition to silicon, the gas includes hydrogen, so that each of the four layers is amorphous-Si:H. For the doped layers, an appropriate dopant is included. For example, the phosphorous gas $PH_3$ may be used in forming the base, while the boron gas $B_2H_6$ may be used in forming the emitter 16 and the top thin layer 22.

In FIG. 1, a number of symbols are included in order to explain the operation of the phototransistor 10. Incoming photons are represented by hv. The incoming photons will generate electron-hole pairs. The flow of the electrons is shown by the arrow associated with the symbol $e^-_{ph}$, while the flow of the holes is represented by the symbol $h^+_{ph}$. Similarly, the flow of electrons and holes as a result of biasing the phototransistor is represented by the systems $e^-_{bipolar}$ and $h^+_{bipolar}$, respectively. The current gain (β) of the phototransistor 10 may be considered to be $I_{bipolar}/I_{photon}$, if the recombination of electrons and holes is disregarded.

Figure 2:
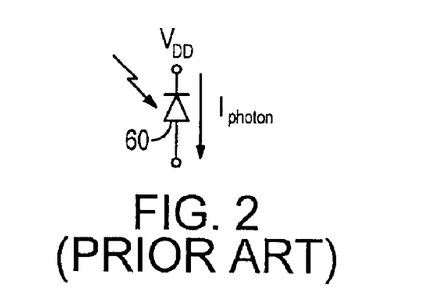
FIG. 2 is a schematic diagram of a conventional photodiode.
Figure 3:
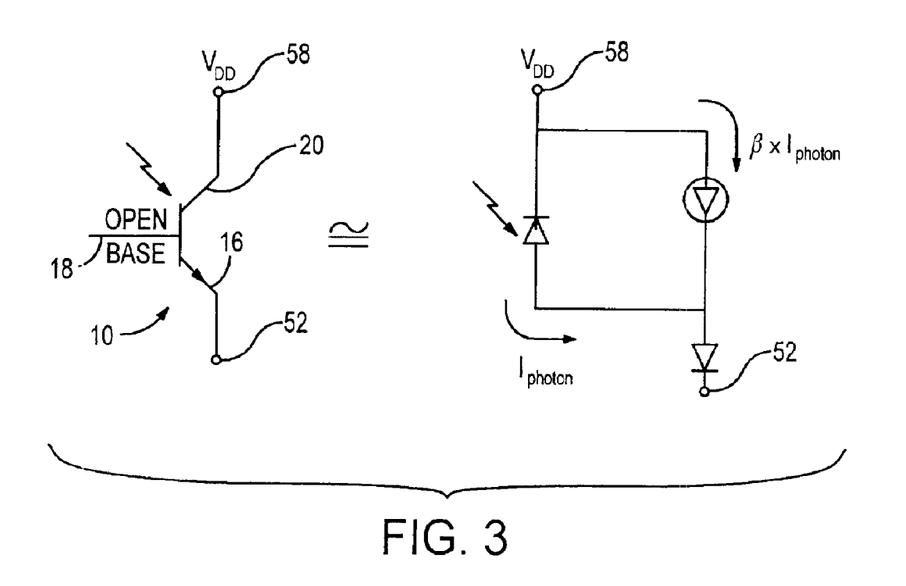
FIG. 3 is a schematic diagram of one of the open base phototransistors of FIG. 1 and an electrical equivalence.

As shown in FIG. 1, the holes $h^+_{ph}$ flow to the base 18. These holes serve as base-hole current injection. The base is left in an electrically open condition, so that bipolar gain for photocurrent is achieved. FIGS. 2 and 3 compare the current flow through a conventional photodiode 60 to the current flow through the open base phototransistor 10 of FIG. 1. In FIG. 2, the photodiode 60 generates a current $I_{photon}$ that is directly responsive to the intensity of light received by the photodiode. In FIG. 3, a comparable current is generated from the collector region 20 to the base region 18. A current gain is achieved by the flow of current from the $V_{DD}$ node 58 to the electrical ground node 52. While not critical to the invention, the current gain can be set at between 5 and 100, depending upon the application. Thus, the photo-transistor 10 of FIGS. 1 and 3 provides a significant improvement over the use of the photodiode 60 of FIG. 2.

Figure 4:
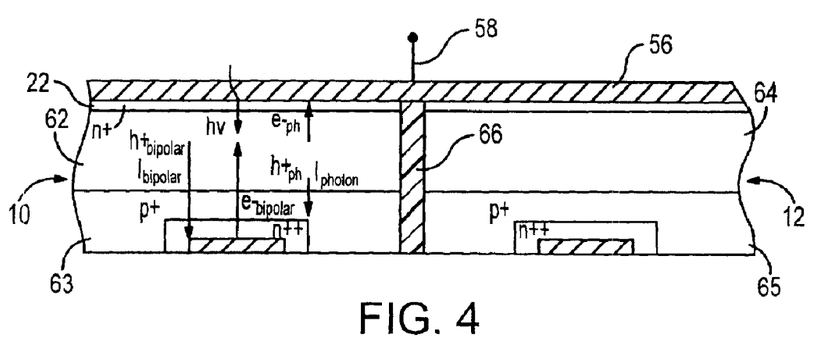
FIG. 4 is a side sectional view of the phototransistors of FIG. 1, but with the intrinsic collector layer being divided according to pixel locations.

As one alternative to the fabrication of an array of amorphous silicon open base phototransistors, a continuous base layer and a continuous intrinsic layer that forms the collector regions may be patterned to provide segmented transistors. Referring to FIG. 4, a dielectric 66 isolates the collector 62 and the base 63 of the first phototransistor 10 from the collector 64 and the base 65 of the second phototransistor 12. The material selected to form the dielectric is not critical. Optionally, the bases 63 and 65 and the collectors 62 and 64 may be separated by air. In FIG. 4, the n+ layer 22 is shown as being divided by the dielectric 66. As one alternative, the thin layer 22 may be continuous, since this will not affect operation of the two phototransistors 10 and 12. As another alternative, the thin layer 22 and the top electrode layer 56 may both be segmented by the dielectric 66. However, this would require a separate connection to each of the phototransistors. For a phototransistor array having a large number of devices, the requirement of separate connections might be undesirable.

Figure 5:
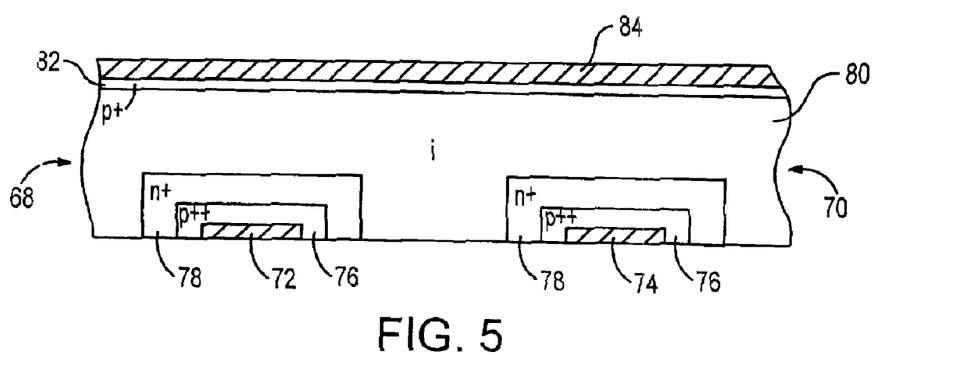
FIG. 5 is a side sectional view of a pair of PNP phototransistors as an alternative to the NPN phototransistors of FIG. 1.

FIG. 5 illustrates another embodiment of the invention. In this embodiment, first and second phototransistors 68 and 70 are PNP devices. The two phototransistors are shown as having electrodes 72 and 74, but the electrodes may be omitted by utilizing a p++ emitter 76 as the contact for interconnection with a substrate which is not shown in FIG. 5. The emitter is an amorphous silicon layer that is deposited using known techniques, such as PECVD. The amorphous silicon layer may be deposited directly on a substrate or may be deposited on a pixel interconnect structure, such as the type described with reference to FIG. 1.

A second amorphous silicon layer is deposited to function as the open base 78 for each of the two phototransistors 68 and 70. Each base includes a dopant having an n+ conductivity. An intrinsic amorphous silicon layer forms the collector 80 for each of the phototransistors. The intrinsic layer includes no intentionally introduced dopant or includes a very low level of dopant.

Atop the intrinsic collector 80 is a thin layer 82 having a p+ dopant. Finally, a top electrode 84 is formed of a conductive material.

The operation of the PNP phototransistors 68 and 70 will be readily understood by persons skilled in the art. The electrical connections are the reverse of those described with reference to FIG. 1. That is, the top electrode 84 is connected to electrical ground or a constant low level voltage. The bottom electrodes 72 and 74 are connected to the floating node of underlying substrate circuitry or external circuitry. Electrons and holes that are generated as a result of incoming photons will propagate in opposite directions, with the propagation to an open base 78 providing current injection that enables the bipolar gain to be responsive to photocurrent.

The open base phototransistors described with reference to FIGS. 1–5 may be operated in an integrating mode in which signals are sensed by integrating the total bipolar current or may be operated in a static mode in which signals are sensed by monitoring the voltage increase at a particular node. The integrating mode will be described with reference to FIGS. 6 and 7, while the static mode will be described with reference to FIGS. 8 and 9.

Figure 6:
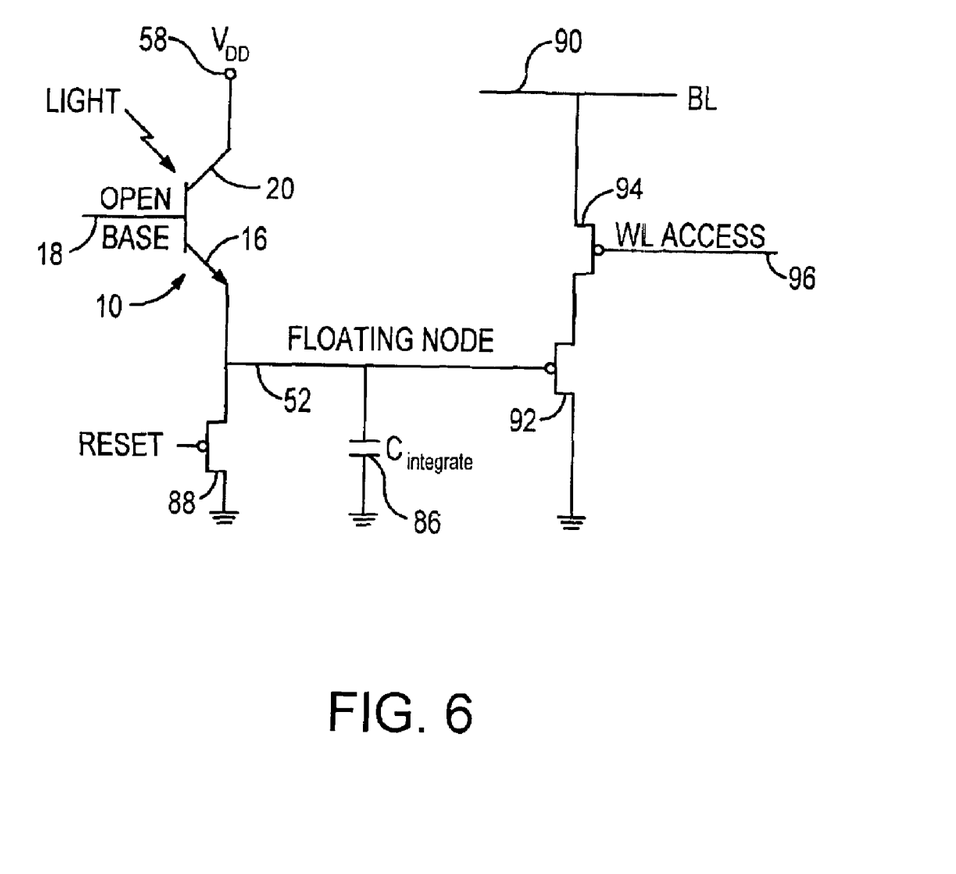
FIG. 6 is a schematic diagram of the NPN phototransistor of FIG. 1 operated in an integrating mode.

In FIG. 6, the NPN phototransistor 10 of FIG. 1 has its emitter 16 connected to a floating node 52 that is linked to electrical ground by an integration capacitor 86 and by a transistor 88. The integration capacitor will charge to a potential that is dependent upon the photocurrent through the phototransistor 10. The integration capacitor may be an intentionally added circuit element or it may be the parasitic capacitance between the base and the collector of the phototransistor in addition to the other parasitic capacitances connected to the floating node. Transistor 88 is used to "reset" the floating node to a potential lower than the high voltage at the beginning of the integration time. The reset is accomplished by turning transistor 88 to the "on" state for a short period and then to the "off" state to begin the integration period. The integrated charge may be read via a bit line 90 by operation of a source follower. Transistors 92 and 94 transfer the voltage on the integration capacitor to the bit line when a write access line 96 receives a signal that turns the transistor 94 to an "on" state. As is well known in the art, an array of photosensors can be serially scanned by selectively activating row-select lines and column-select lines. When the transistor 94 is in an "off" state, the integration capacitor 86 is charged. It is this charge that is periodically read. The integration period is the time between the reset of the floating node and the reception of the appropriate signal at the write access line 96.

Comparing FIGS. 1 and 6, the emitter 16, base 18 and collector 20 are formed by the amorphous silicon layers. The transistors 88, 92 and 94 are formed within the silicon substrate 24. For example, the transistor 92 in FIG. 6 may be the transistor 26 in FIG. 1, if the conductive path 48 along the surface of the substrate is connected to the gate 32 of the transistor 26.

Figure 7:
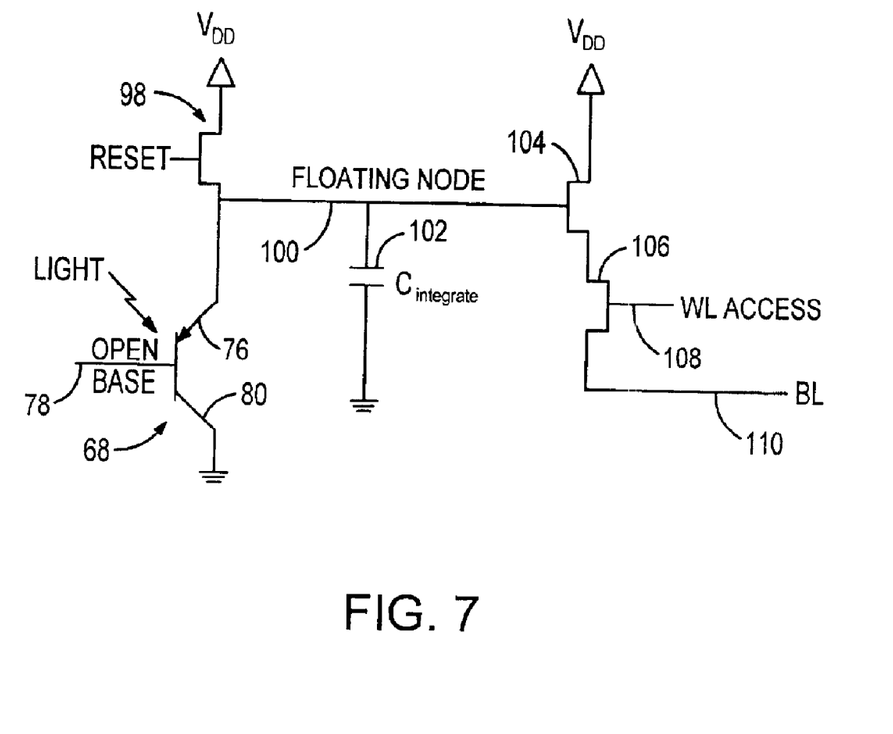
FIG. 7 is a schematic diagram of the PNP phototransistor of FIG. 5 operated in an integrating mode.

In FIG. 7, the PNP phototransistor 68 of FIG. 5 is shown as having its collector 80 connected to electrical ground and having its emitter 76 connected to a source/drain region of a transistor 98. The other source/drain region of the transistor 98 is connected to $V_{DD}$. Transistor 98 is used to reset the floating node 100 to a potential above the electrical ground at the beginning of the integration time. The collector 80 of the phototransistor 68 is connected to an integration capacitor 102, which, as before, may be a separate circuit element or the parasitic base-collector capacitance of the phototransistor and the other parasitic capacitances connected to the floating node. The voltage across the integration capacitor depends on the total current through the phototransistor during the integration time. This voltage is transferred to a bit line 110 by transistors 104 and 106 when the write line 108 turns the transistor 106 to the "on" state. Thus, the signal that is transferred to a bit line 110 will be dependent upon the intensity of light received by the phototransistor 68 during an integration time. As is well known in the art, a two-dimensional array of phototransistors may be serially accessed by selectively activating transistors.

Figure 8:
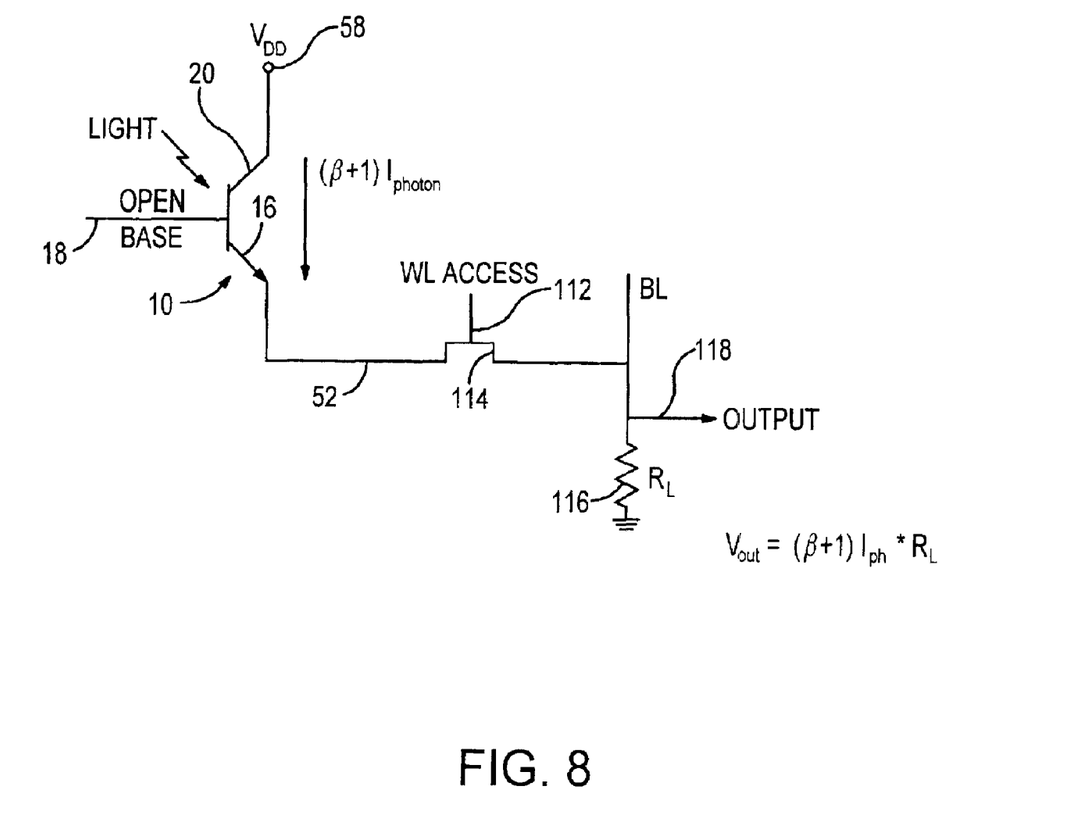
FIG. 8 is a schematic diagram of the NPN phototransistor of FIG. 1 operated in a static mode.

In FIG. 8, the open base phototransistor 10 of FIG. 1 is operated in the static mode. In this mode, the circuit monitors the voltage increase at the node 52 connected to the emitter 16 of the phototransistor. A signal along a write access line 112 selectively turns a transistor 114 to an "on" state. A load resistor 116 is connected between ground and an output line 118. During a read operation of a phototransistor 10, the voltage drop across the load resistor will depend upon the current flow through the phototransistor, as indicated by the equation:

$$V_{out}=(62+1)I_{photon}*R_L$$

Figure 9:
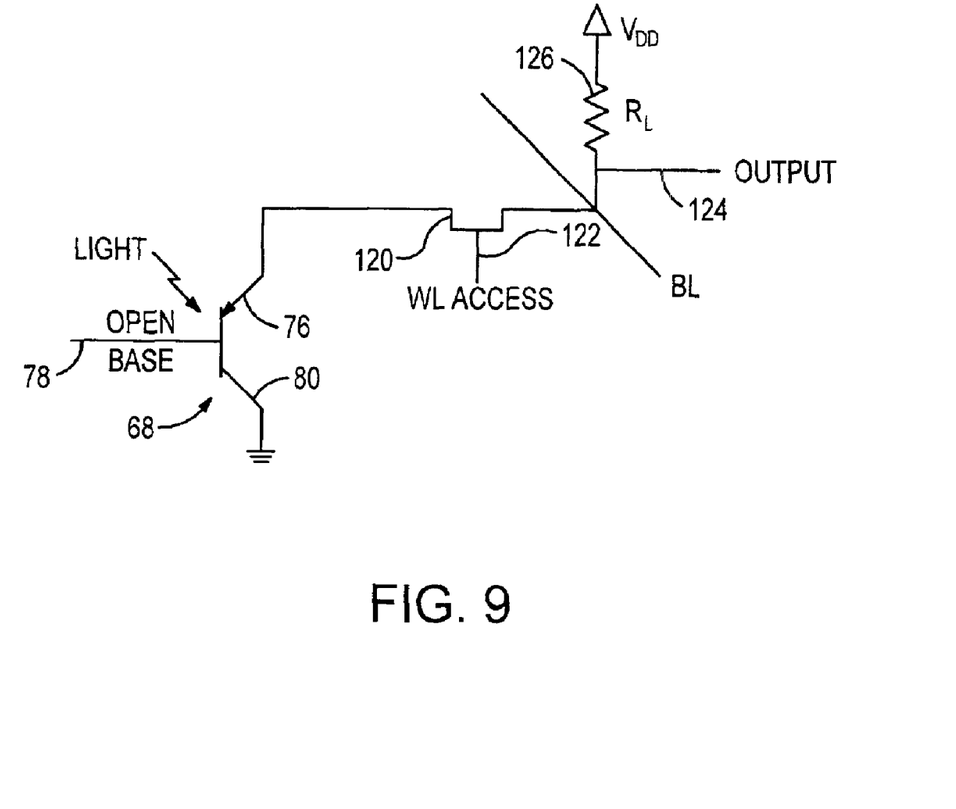
FIG. 9 is a schematic diagram of the PNP phototransistor of FIG. 5 operated in a static mode.

In FIG. 9, the PNP transistor 68 is being used in a static mode operation. By selectively activating a transistor 120 by means of a signal along a write access line 122, the voltage along an output line 124 may be read as the output of the phototransistor 68, since the voltage drop across a load resistor 126 will depend upon the current flow through the phototransistor.

The circuits shown in FIGS. 6–9 are examples of possible applications for the amorphous silicon open base phototransistors. However, other applications may be utilized without diverging from the invention. Moreover, other amorphous semiconductors may be substituted for the amorphous silicon.

What is claimed is:

1. An imaging arrangement comprising:
   a substrate; and
   an array of amorphous semiconductor bipolar phototransistors on said substrate, said bipolar phototransistors being open base devices, each said bipolar phototransistor including a plurality of amorphous semiconductor layers, said plurality of amorphous semiconductor layers including at least one p-type layer and at least one n-type layer, each said bipolar phototransistor having an electrically open amorphous semiconductor base layer free from external control that is configured to provide base-hole current injection for enabling bipolar gain for photocurrent through the phototransistor, wherein the photocurrent represents the light intensity received by said phototransistor;

wherein each said bipolar phototransistor includes an intrinsic collector layer and wherein at least a portion of said electrically open amorphous semiconductor base layer resides between said substrate and said intrinsic collector layer, said amorphous semiconductor base lever being amorphous silicon.

2. An imaging arrangement comprising:

a substrate;

an array of amorphous semiconductor bipolar phototransistors on said substrate, said bipolar phototransistors being open base devices, each said bipolar phototransistor including a plurality of amorphous semiconductor layers, said plurality of amorphous semiconductor layers including at least one p-type layer and at least one n-type layer, each said a bipolar phototransistor having an electrically open amorphous semiconductor base layer free from external control that is configured to provide base-hole current injection for enabling bipolar gain for photocurrent through the phototransistor, Wherein the photocurrent represents the light intensity received by said phototransistor, and processing circuitry at least partially formed within said substrate.

3. The imaging arrangement of claim 1 wherein each said bipolar phototransistor is an open base NPN bipolar transistor having an n-type amorphous semiconductor emitter layer that is spaced apart from an intrinsic collector layer by a p-type amorphous semiconductor base layer.

4. The imaging arrangement of claim 3 wherein each said bipolar phototransistor includes a second n-type amorphous semiconductor layer in contact with said intrinsic collector layer and further includes a transparent top electrode.

5. The imaging arrangement of claim 1 wherein each said bipolar phototransistor is an open base PNP bipolar transistor having a p-type amorphous semiconductor emitter layer that is spaced apart from an intrinsic collector layer by an n-type amorphous semiconductor base layer.

6. An imaging arrangement comprising:

an array of open base bipolar photosensors, each said photosensor having an emitter layer that is spaced apart from a collector layer by a base layer, said emitter, base and collector layers of said photosensor being amorphous semiconductor layers having conductivities selected to provide a light-responsive device, each said photosensor including a photocurrent having a gain that is at least partially based on an open condition at said base layer that is free from external control, wherein the photocurrent represents the light intensity received by said phototransistor; and a substrate on which said array is formed, said substrate having processing circuitry integrated therein, said processing circuitry being coupled to said bipolar photosensors.

7. The imaging arrangement of claim 6 wherein each said photosensor is an open base bipolar phototransistor in which said collector layer is an intrinsic amorphous silicon layer.

8. The imaging arrangement of claim 6 wherein each said bipolar photosensor is an NPN phototransistor.

9. The imaging arrangement of claim 6 wherein each said bipolar photosensor is a PNP phototransistor.

10. The imaging arrangement of claim 6 wherein said amorphous semiconductor layers are formed of an organic semiconductor.

11. The imaging arrangement of claim 2 wherein each said bipolar phototransistor is electrically coupled to said processing circuitry by an electrode.

* * * * *